United States Patent

Kawano et al.

[11] Patent Number: 5,958,285
[45] Date of Patent: Sep. 28, 1999

[54] SINTERED PIEZOELECTRIC CERAMIC, PIEZOELECTRIC CERAMIC DEVICE, MONOLITHIC PIEZOELECTRIC CERAMIC DEVICE, AND METHOD FOR PRODUCING SINTERED PIEZOELECTRIC CERAMIC

[75] Inventors: Koichi Kawano, Shiga-ken; Kazuya Kamada, Kusatsu, both of Japan

[73] Assignee: Murata Mnufacturing Co., Ltd., Japan

[21] Appl. No.: 09/105,655

[22] Filed: Jun. 26, 1998

[30] Foreign Application Priority Data

Jun. 27, 1997 [JP] Japan ................................ 9-172226
Apr. 2, 1998 [JP] Japan ................................ 10-090144

[51] Int. Cl.$^6$ ..................... C04B 35/49; H01L 41/187
[52] U.S. Cl. .......................... 252/62.9 R; 252/62.9 PZ; 310/311; 310/364; 310/366; 501/103; 501/104; 501/134; 501/135; 501/136; 501/137; 501/138; 501/139
[58] Field of Search ................. 252/62.9 R, 62.9 PZ; 501/103, 104, 134, 135, 136, 137, 138, 139; 310/311, 364, 366

[56] References Cited

U.S. PATENT DOCUMENTS

| | | | |
|---|---|---|---|
| 2,708,243 | 5/1955 | Brajer | 501/139 |
| 3,103,441 | 9/1963 | Cline et al. | 501/137 |
| 5,486,491 | 1/1996 | Sengupta et al. | 501/104 |

FOREIGN PATENT DOCUMENTS 55-144475 11/1980 Japan .................. 252/62.9

*Primary Examiner*—C. Melissa Koslow
*Attorney, Agent, or Firm*—Ostrolenk, Faber, Gerb & Soffen, LLP

[57] ABSTRACT

Disclosed is a sintered piezoelectric ceramic which is resistant to the high voltage for polarization with no dielectric breakdown and has good moisture resistance. When a plurality of the ceramics are fired, they are prevented from being fused and combined together. The production costs of the ceramic are low. The sintered piezoelectric ceramic comprises particulate or agglomerate zirconia grains dispersed in piezoelectric ceramic grains, in which the mean grain size of the piezoelectric ceramic grains is smaller than that of the zirconia grains.

20 Claims, 3 Drawing Sheets

SINTERED PIEZOELECTRIC CERAMIC, PIEZOELECTRIC CERAMIC DEVICE, MONOLITHIC PIEZOELECTRIC CERAMIC DEVICE, AND METHOD FOR PRODUCING SINTERED PIEZOELECTRIC CERAMIC

FIELD OF THE INVENTION

The present invention relates to a sintered piezoelectric ceramic, and a method for producing it, and to a piezoelectric ceramic device.

BACKGROUND OF THE INVENTION

Piezoelectric ceramic devices produced by forming electrodes on sintered piezoelectric ceramics (hereinafter referred to as sintered ceramics) have been used in ceramic filters, speakers, ultrasonic oscillators, etc. In general, piezoelectric ceramic devices are polarized by direct current voltage so as to orient their polarization in the same direction. In order to increase the degree of polarization of the devices, high voltage is applied to the devices, and the devices are required to be resistant to the high voltage for polarization with no dielectric breakdown.

Because piezoelectric ceramic devices are often used under severe conditions, sintered ceramics are required to have good weather resistance, especially good moisture resistance.

Sintered ceramics are obtained by calcining a piezoelectric ceramic, then mixing it with a binder, granulating the resulting mixture, molding the resulting granular pellets and firing the molding. Usually, the molded units ("moldings") are stacked in a furnace to fire as many as possible. However, there is a problem in that the stacked moldings fuse so as to be combined together at high temperatures. To solve this problem, the following methods have been proposed.

As illustrated in FIG. 1, particles 25 are provided between stacked moldings 23. The particles used include zirconia, $Al_2O_3$ and the like. First, the powder 25 is spread over a support (not shown). Then a molding 23 is put thereon. Further, the powder 25 is spread over the upper surface of the molding 23, and the other moldings 23 are piled up thereon one after another with spacing via the powder 25.

Another method is illustrated in FIG. 2 with reference to Japanese Patent Publication (JP-B) Hei-3-2821. Coarse grains 23a having the same composition as that of the moldings 23 but having a large mean grain size are dispersed in each molding 23, by which the moldings 23 are prevented from being combined together. The is referred to as a coarse grains-mixing method. The moldings 23 can be piled up without providing powders therebetween.

In the above-methods, piles of the moldings 23 are fired and then they are separated into individual sintered moldings 23.

However, the sintered ceramics produced by the conventional methods do not sufficiently satisfy recent requests in the market for piezoelectric ceramics having much better characteristics including moisture resistance and being much low-priced.

In addition, the conventional method have the following problems:

1. An additional step is required for removing powder from the sintered moldings.

2. The sintered moldings still have traces of the powder 25.

3. It is difficult to evenly spread the powder 25 between the adjacent moldings 23 and this causes great warping of the moldings 23. Therefore, the sintered moldings must be re-heated to remove the warping.

The coarse grains-mixing method is also problematic in the following points:

1. Since the coarse grains 23a have the same composition as that of the moldings 23, some amount of the grains may be combined with the moldings 23 even under a relatively low firing temperature.

2. Under a high firing temperature, most of the grains are combined with the moldings 23.

3. The coarse grains 23a must be prepared in an additional step. In addition, different types of coarse grains must be prepared for different compositions of piezoelectric ceramics. Therefore, the method using such coarse grains is expensive.

SUMMARY OF THE INVENTION

One object of the present invention is to provide sintered piezoelectric ceramics which are resistant to high polarization voltage with no dielectric breakdown and have good moisture resistance, and to provide a method for producing them. While being produced by firing piles of green piezoelectric ceramics, the sintered piezoelectric ceramics of the invention are prevented from being combined together, and the costs for producing them are low.

The first aspect of the present invention provides a sintered piezoelectric ceramic containing particulate or agglomerate zirconia grains dispersed in piezoelectric ceramic grains, in which the mean grain size of the piezoelectric ceramic grains is smaller than that of the zirconia grains.

The second aspect of the present invention provides a sintered piezoelectric ceramic comprising an essential component of piezoelectric ceramic grains and a side component of zirconia grains, in which the mean grain size of the zirconia grains is larger than that of the piezoelectric ceramic grains.

Having the constitution noted above, the sintered piezoelectric ceramics are prevented from being fused and combined together because of the zirconia grains existing in the vicinity of the surface layer of the ceramics. In addition, the ceramics are resistant to high polarization voltage with no dielectric breakdown and have good moisture resistance.

In the sintered ceramics noted above, the mean grain size of the piezoelectric ceramic grains is preferably from about 0.5 to 9.0 μm, and the mean grain size of the zirconia grains is preferably from about 10 to 30 μm. This is the third aspect of the invention.

Having the grain sizes as above enables one to prevent of combining of the sintered ceramics of the invention, while ensuring smooth surfaces of the sintered ceramics. The surface smoothness referred to herein indicates that the surfaces of the sintered ceramics are so smooth that electrodes can be formed thereon with no difficulty and that the sintered ceramics are resistant to the pressure of lamination.

In the sintered ceramics noted above, the amount of the zirconia grains is preferably from about 0.1 to 3.0% by weight of the piezoelectric ceramic grains. This is the fourth aspect of the invention. In this aspect, as the amount of the zirconia grains in the sintered ceramics is defined above, the moldings formed from the sintered ceramics are resistant to higher polarization voltage with no dielectric breakdown and have better moisture resistance.

The sintered piezoelectric ceramics of the invention having the constitution noted above are resistant to the high voltage for polarization with no dielectric breakdown and have good moisture resistance, and, in addition, they are prevented from being fused and combined together.

The fifth aspect of the invention is a piezoelectric ceramic device to be produced by forming electrodes on the both major surfaces of the sintered piezoelectric ceramic of any one of the first to fourth aspects of the invention. Since the sintered piezoelectric ceramic noted above is used herein, the piezoelectric ceramic device is resistant to the high voltage for polarization with no dielectric breakdown and has good moisture resistance.

The sixth aspect of the invention is a monolithic piezoelectric ceramic device comprising layers of the sintered piezoelectric ceramic of any one of the first to fourth aspects of the invention, and layers of inner electrodes laminated between the adjacent sintered piezoelectric ceramic layers, and having outer electrodes connected with the exposed surfaces of the inner electrodes. Having the constitution noted above, the monolithic devices are prevented from being fused and combined together when they are fired into sintered monolithic devices. In addition, the monolithic device is resistant to the high voltage for polarization with no dielectric breakdown and has good moisture resistance.

The seventh aspect of the invention is a method for producing sintered piezoelectric ceramics, which comprises (1) the step of mixing powdery materials for a piezoelectric ceramic to give a powdery mixture, (2) the step of calcining the mixture to obtain a calcined body, (3) the step of grinding the calcined body into a ground powder, (4) the step of mixing the powder with a binder to obtain a binder-containing mixture, (5) the step of molding the mixture into a molding, and (6) the step of firing the molding into a sintered molding, and which is characterized in that particulate or agglomerate zirconia grains of which the mean grain size is larger than that of the grains constituting the sintered body (i.e., the calcined piezoelectric ceramic) are added to the ceramic after the step of obtaining the calcined body but before the step of obtaining the molding.

The eighth aspect of the invention is a method for producing sintered piezoelectric ceramics, which comprises (1) the step of mixing powdery materials for a piezoelectric ceramic to give a powdery mixture, (2) the step of calcining the mixture to obtain a calcined body, (3) the step of grinding the calcined body into a ground powder, (4) the step of mixing the powder with a binder to obtain a binder-containing mixture, (5) the step of granulating the binder-containing mixture into granular pellets, (6) the step of molding the pellets into a molding, and (7) the step of firing the molding into a sintered molding, and which is characterized in that particulate or agglomerate zirconia grains of which the mean grain size is larger than that of the grains constituting the sintered body are added to the ceramic after the step of obtaining the calcined body but before the step of obtaining the molding.

In those methods where particulate or agglomerate zirconia grains are added to the piezoelectric ceramic molding, the sintered ceramics are prevented from being fused and combined together while they are being fired.

In the methods for producing sintered piezoelectric ceramics noted above, the zirconia grains are preferably added to the ground powder of the calcined body. This is the ninth aspect of the invention.

In the methods, it is also preferable to add the zirconia grains to the ceramic along with the binder in the step of preparing the binder-containing mixture, or to add them after the step of preparing the binder-containing mixture. This is the tenth aspect of the invention.

In the methods, it is also preferable to add the zirconia grains to the ceramic after the step of preparing the granular pellets. This is the eleventh aspect of the invention.

Adding the zirconia grains to the ceramic in any of the steps noted above enables prevention of combining of the sintered ceramics in the step of firing the ceramics.

In the methods for producing sintered piezoelectric ceramics, the mean grain size of the sintered ceramic grains preferably falls between about 0.5 and 9.0 $\mu$m and the mean grain size of the zirconia grains added preferably falls between about 10 and 30 $\mu$m. This is the twelfth aspect of the invention. Having the grain sizes as above enables one to prevent combining of the sintered ceramics, while ensuring smooth surfaces of the sintered ceramics.

In the methods, it is also preferable that the amount of the zirconia grains to be added is from about 0.1 to 3.0% by weight of the ceramic grains. This is the thirteenth aspect of the invention. In this aspect, as the amount of the zirconia grains added as above, the sintered ceramics are more effectively prevented from being fused and combined together in the firing step, and, in addition, the piezoelectric characteristics of the sintered ceramics are prevented from becoming worse.

In the methods as above, zirconia grains are dispersed in piezoelectric ceramic grains, whereby the sintered ceramics are prevented from being fused and combined together in the firing step.

DETAILED DESCRIPTION OF THE INVENTION

Figure 1:
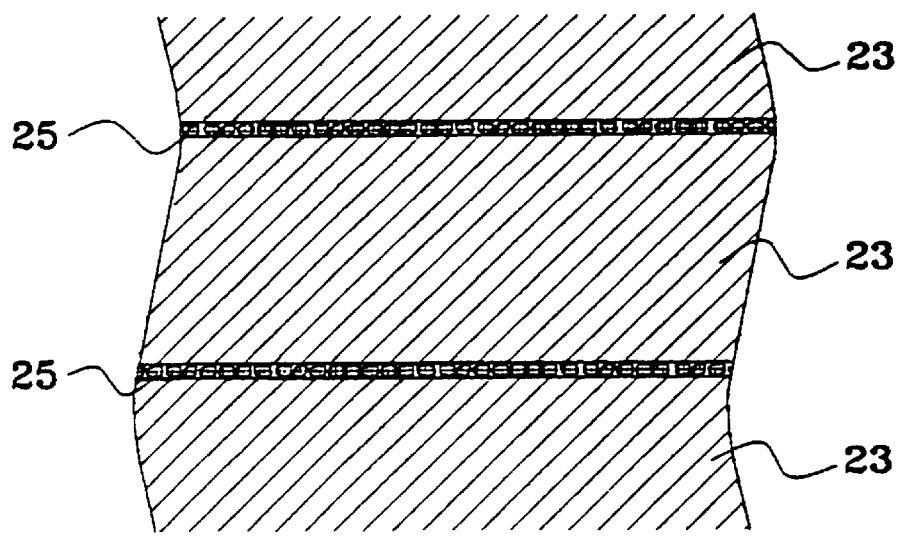
FIG. 1 is a cross-sectional view showing a laminated condition of conventional piezoelectric ceramics to be fired.

In the drawings, 1 is a sintered piezoelectric ceramic, 2 is PZT (piezoelectric ceramic), 3 is a molded disc, 5 is zirconia, 7 is a silver electrode, 9 is a piezoelectric ceramic device, 10 is a monolithic piezoelectric ceramic device, 11 is a monolithic sintered body, 12 is an inner electrode and 13 is an outer electrode.

Piezoelectric ceramics used in producing the sintered piezoelectric ceramics of the invention are not limited with respect to their composition. Any and every piezoelectric ceramic is employable herein. Concretely mentioned are, for example, single-component systems such as $BaTiO_3$, $PbTiO_3$, $K_xWO_3$, $PbNb_2O_6$, etc.; two-component systems such as $PbTiO_3$-$PbZrO_3$, $PbTiO_3$-$Pb(Mg_{1/3}Nb_{2/3})O_3$, etc.; and three-component systems such as $PbTiO_3$-$PbZrO_3$-$Pb(Mg_{1/3}Nb_{2/3})O_3$, $PbTiO_3$-$PbZrO_3$-$Pb(Co_{1/3}Nb_{2/3})O_3$, etc. Detailed examples of composite oxides and compounds employable herein are shown in Table 1 below. Also employable are derivatives of the compositions shown in Table 1 obtained by partly substituting Pb with any of Ba, Sr, Ca or the like, or by partly substituting Ti with any of Sn, Hf or the like.

TABLE 1

| Examples of Composite Oxides | | Examples of Compounds |
|---|---|---|
| Perovskites | $A^{2+}B^{4+}O_3$ | A: Pb, Ba, Ca, Sr, Cd, etc. |
| | | B: Sn, Hf, etc. |
| | $A^{1+}B^{5+}O_3$ | A: Li, Na, K, Ag, etc. |
| | | B: Nb, Ta, etc. |
| Perovskite-structured Composites | $A^{2+}(B^{2+}_{1/3}B^{3+}_{2/3})O_3$ | $Pb(Mg_{1/3}Nb_{2/3})O_3$, $Pb(Mg_{1/3}Ta_{2/3})O_3$ |
| | | $Pb(Ni_{1/3}Nb_{2/3})O_3$, $Pb(Mn_{1/3}Ta_{2/3})O_3$ |
| | | $Pb(Mn_{1/3}Sb_{2/3})O_3$, $Pb(Zn_{1/3}Nb_{2/3})O_3$ |
| | | $Pb(Zn_{1/3}Ta_{2/3})O_3$, $Pb(Mn_{1/3}Nb_{2/3})O_3$ |
| | | $Pb(Co_{1/3}Sb_{2/3})O_3$, $Pb(Zn_{1/3}Nb_{2/3})O_3$ |
| | | $Pb(Co_{1/3}Nb_{2/3})O_3$, $Pb(Fe_{1/3}Sb_{2/3})O_3$ |
| | | $Pb(Fe_{1/3}Nb_{2/3})O_3$, $Pb(Mn_{1/3}Bi_{2/3})O_3$, etc. |
| | $A^{2+}(B^{3+}_{1/2}B^{5+}_{1/2})O_3$ | $Pb(Fe_{1/2}Nb_{1/2})O_3$, $Pb(Sc_{1/2}Ta_{1/2})O_3$ |
| | | $Pb(Y_{1/2}Nb_{1/2})O_3$, $Pb(Mn_{1/2}Sb_{1/2})O_3$ |
| | | $Pb(In_{1/2}Nb_{1/2})O_3$, $Pb(Mn_{1/2}Sb_{1/2})O_3$ |
| | | $Pb(Mn_{1/2}Nb_{1/2})O_3$, etc. |
| | $A^{2+}(B^{2+}_{1/2}B^{5+}_{1/2})O_3$ | $Pb(Cd_{1/2}W_{1/2})$, $Pb(Mg_{1/2}W_{1/2})O_3$ |
| | | $Pb(Co_{1/2}W_{1/2})O_3$, $Pb(Ni_{1/2}W_{1/2})O_3$ |
| | | $Pb(Mn_{1/2}W_{1/2})O_3$, $Pb(Ca_{1/2}W_{1/2})O_3$, etc. |
| | $A^{2+}(B^{2+}_{2/3}B^{6+}_{1/2})O_3$ | $Pb(Fe_{2/3}W_{1/2})O_2$, $Pb(Mn_{1/3}W_{1/3})$, etc. |
| | $A^{3+}(B^{2+}_{1/2}B^{4+}_{1/2})O_3$ | $La(Mg_{1/2}Ti_{1/2})O_3$, $Nd(Mg_{1/2}Ti_{1/2})O_3$, etc. |
| | $(A^{1+}_{1/2}A^{3+}_{1/2})B^{4+}O_3$ | $(K_{1/2}La_{1/2})TiO_3$, $(Na_{1/2}Bi_{1/2})TiO_3$, etc. |
| | $A^{2+}(B^{1+}_{1/4}B^{5+}_{3/4})O_3$ | $Pb(Li_{1/4}Nb_{3/4})O_3$, $Pb(Cu_{1/4}Nb_{3/4})O_3$ |
| | | $Pb(Li_{1/4}Sb_{3/4})O_3$, etc. |
| Pyrochroite-structured Composites | $A_2B_2O_7$ | A: Ba, Ca, Sr, Cd, La, Nd, Pb, etc. |
| | | B: Ta, Nb, Ti, etc. |
| Phyllo-structured Bismuth Composites | $Bi_2A_{x-1}B_xO_{3x+3}$ | A: Ba, Ca, Sr, Cd, La, Nd, Pb, etc. |
| | | B: Ta, Nb, Ti, etc. |
| Tungsten-bronze Composites | $A_xB_2O_3$ | A: Pb, Ba, Sr, etc. |
| | | B: Nb, Ta, etc. |

Preferably, the piezoelectric ceramic grains being sintered have a mean grain size smaller than that of the zirconia grains added thereto, more preferably have a mean grain size of from about 0.5 $\mu$m to 9.0 $\mu$m.

The particulate or agglomerate zirconia grains added to the piezoelectric ceramics act to prevent the sintered ceramics from being fused and combined together. The amount and the grain size of the zirconia grains added are not limited so long as the zirconia grains have a mean grain size larger than that of the piezoelectric ceramic grains. However, in view of the combining degree, the outward appearance and the electric characteristics of the sintered ceramics, the amount of the zirconia grains is preferably from about 0.1 to 3.0% by weight, more preferably from about 0.5 to 2% by weight, and the mean grain size thereof is preferably from about 10 to 30 $\mu$m, more preferably from about 15 to 25 $\mu$m. The zirconia to be used in the invention is not limited to $ZrO_2$ only, but includes those as stabilized with a stabilizer such as $Y_2O_3$, MgO, CaO or the like. The amount of the zirconia used herein is based on the weight of the piezoelectric ceramics to which it is added.

The monolithic piezoelectric ceramic device of the invention comprise layers of the sintered piezoelectric ceramic and inner electrode layers laminated therein, in which, however, the pattern of the inner electrodes formed and that of outer electrodes applied to the device are not limited.

In the method for producing the sintered piezoelectric ceramics of the invention, the step of forming granular pellets may be effected through spray granulation, but is not limited thereto. In the method, the step of forming moldings may be effected through compression molding or extrusion molding. Extrusion molding does not require the granulation step.

The reference to particulate or agglomerate grains herein is not meant to specifically define the size of the grains, but indicates an independent condition of single or plural grains. Regarding the morphology of the grains, the grains are not limited to nearly spherical ones only.

In the method for producing the sintered piezoelectric ceramics of the invention, the step of adding particulate or agglomerate zirconia grains to piezoelectric ceramic grains is preferably effected after the step of calcining the piezoelectric ceramic grains but before the step of forming moldings. In the step of adding zirconia, the word "adding" includes mixing zirconia grains and piezoelectric ceramic grains and stirring them to thereby add the zirconia grains to the piezoelectric ceramic grains. Apart from this, if desired, zirconia grains may be added to calcined ceramics, then ground and stirred.

Now, the invention is described in more detail with reference to the following Examples, which, however, are not intended to restrict the scope of the invention.

EXAMPLE 1

Figure 3:
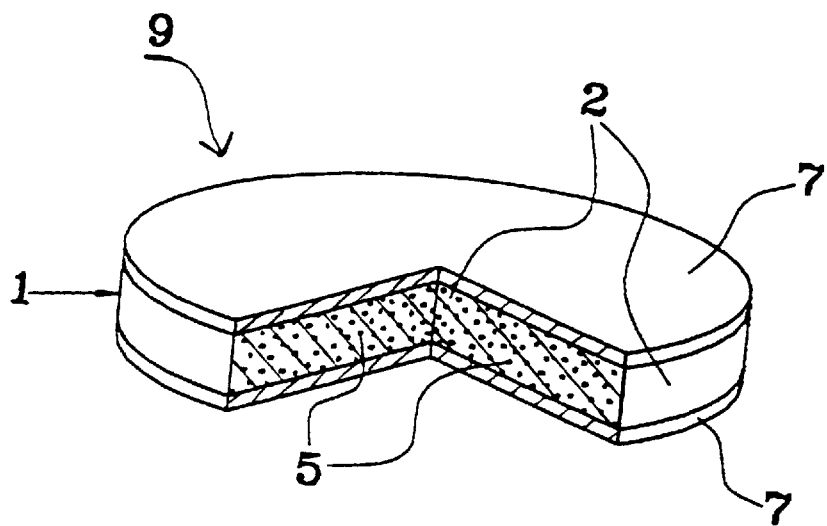
FIG. 3 is a partly-cut, perspective view showing a piezoelectric ceramic device in which is used the sintered piezoelectric ceramic of the invention.

FIG. 3 is a partly-cut, perspective view showing a piezoelectric ceramic device comprising the sintered piezoelectric ceramic of the invention.

The piezoelectric ceramic device 9 of the invention illustrated in FIG. 3 was produced in the manner mentioned below.

First, raw materials of a piezoelectric ceramic, $TiO_2$, $ZrO_2$ (zirconia) and PbO, were mixed in a ball mill. Next, the resulting mixture was calcined at a temperature falling between 800 and 1000° C., and then ground in an impact grinder to obtain a ground powder.

Next, zirconia, $ZrO_2$, was added to the powder to give a mixed powder. To this was added a binder of polyvinyl alcohol acting to solidify it, and stirred to obtain a binder-containing mixture. Next, the thus-stirred mixture was granulated through spray drying to obtain granular pellets.

The resulting granular pellets are press-molded into disc moldings. Then, the moldings were laminated as in FIG. 4, and fired at a temperature falling between 1000 and 1300° C. for a predetermined period of time, and thereafter separated into individual units. Thus was obtained the sintered discs 1.

Figure 2:
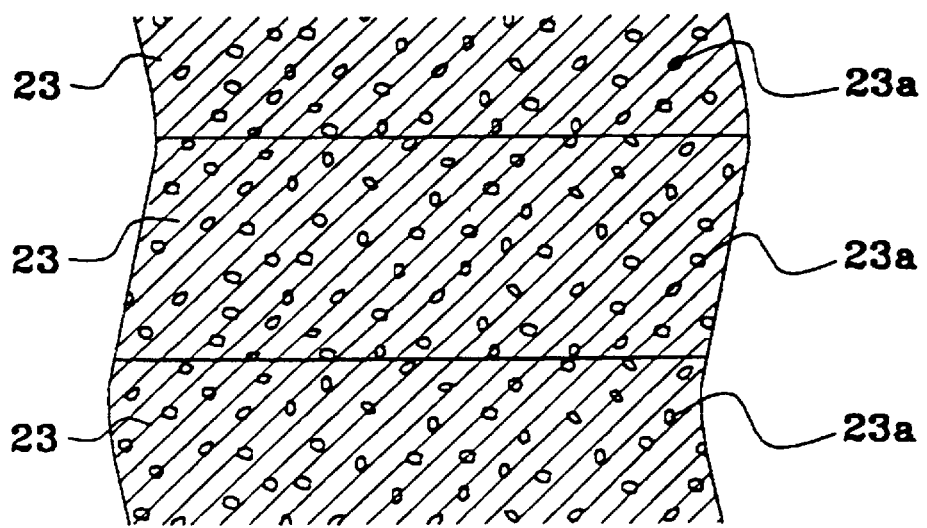
FIG. 2 is a cross-sectional view showing another laminated condition of conventional piezoelectric ceramics to be fired.
Figure 4:
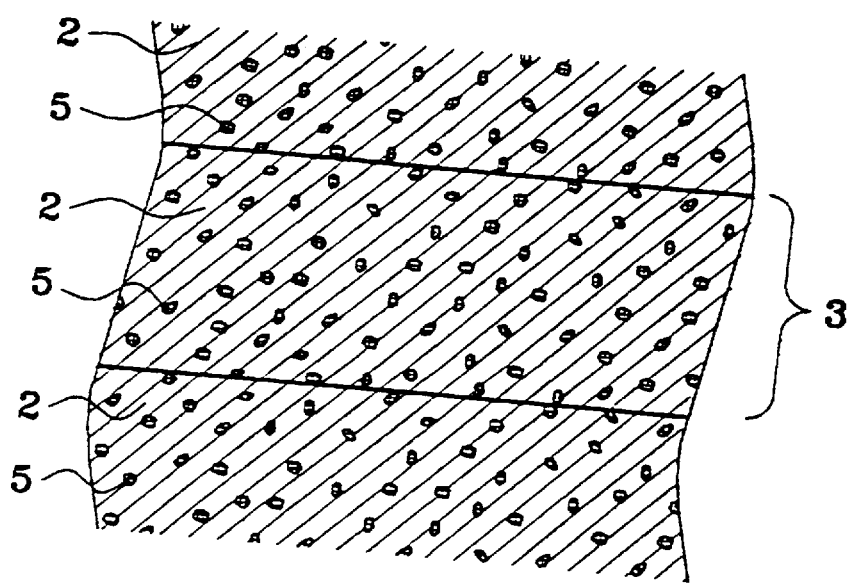
FIG. 4 is a cross-sectional view showing a laminated condition of piezoelectric ceramics of the invention which are to be fired.

Next, a silver electrode 7 was attached onto both major surfaces of the sintered disc 1 through firing, and thereafter direct current voltage was applied thereto for polarization. Thus was obtained a disc-shaped, piezoelectric ceramic device 9 having a diameter of 10 mm and a thickness of 1 mm. In FIG. 3 and FIG. 4, 2 is PZT, and 5 is $ZrO_2$.

The degree to which the sintered discs 1 combined was checked. In addition, the warping degree of those discs was observed, and the electric characteristics of the piezoelectric ceramic device 9 comprising the sintered disc 1 were measured. The data obtained are shown in Table 2 below. The comparative sample in Table 2 comprises a comparative, sintered piezoelectric ceramic, which did not contain particulate or agglomerate zirconia grains in the piezoelectric ceramic matrix and which was produced in a conventional method. The samples tested were evaluated for their combining degree as follows: Those not combined are marked with "O"; those that were partly combined but could be separated into individual units are marked with "Δ"; and those that could not be separated into individual units are marked with "X". In Table 2, the sample marked with * is outside the scope of the invention.

if the amount is 0% by weight as in Sample No. 1, the sintered ceramics are unfavorably fused and combined together.

The reason why the amount of zirconia, $ZrO_2$, added is not larger than about 3.0% by weight is because if the amount is 4.0% by weight as in Sample No. 8, the breakdown voltage for polarization of the ceramic device is unfavorably low, even though the sintered ceramics are not fused and combined together and could attain the object of the invention.

EXAMPLE 2

The procedure by which the sintered disc 1 was obtained in Example 1, to which had been added 2% by weight of $ZrO_2$, was repeated except that the mean grain size of the PZT and that of $ZrO_2$ were varied. The combining degree of each sample was checked, and the surface smoothness of each sample was measured. The data obtained are shown in Table 3 below. The samples tested herein were evaluated for their combining degree as follows: Those not combined are marked with "O"; those that were partly combined but could be separated into individual units are marked with "Δ"; and those that could not be separated into individual units are marked with "X". Regarding their surface smoothness, the samples of which the surface smoothness was better than that of conventional sintered ceramics are marked with "O"; and those of which the surface smoothness was worse than that of conventional sintered ceramics are marked with "X".

TABLE 2

| Sample No. | Amount of $ZrO_2$ Added (grain size: 20 μm) (wt. %) | Degree of combining | Warping (μm) | Break-down Voltage for Polarization (kV) | Change after Moisture-resistance Test for 1000 hrs | | |
|---|---|---|---|---|---|---|---|
| | | | | | Fr (%) | kP (%) | Cx (%) |
| *1 | 0 | x | 48 | 6.0 | −0.42 | 2.01 | 1.37 |
| 2 | 0.1 | Δ | 10 | 6.2 | −0.31 | 1.58 | 0.98 |
| 3 | 0.3 | Δ | 11 | 6.8 | −0.20 | 1.13 | 0.44 |
| 4 | 0.5 | o | 11 | 7.0 | −0.09 | 0.75 | 0.29 |
| 5 | 1 | o | 8 | 7.5 | 0.03 | 0.58 | 0.03 |
| 6 | 2 | o | 12 | 7.6 | 0.12 | 0.32 | −0.58 |
| 7 | 3 | o | 19 | 7.0 | 0.29 | 0.12 | −0.89 |
| 8 | 4 | o | 22 | 5.2 | 0.57 | −0.54 | −1.96 |
| Comparative Sample | 0 | o | 72 | 6.1 | −0.40 | 1.97 | 1.31 |

In addition, the break-down voltage for polarization of each sample, and the change in the electric characteristics of each sample having been subjected to a moisture-resistance test were measured. The break-down voltage for polarization indicates the voltage for dielectric breakdown of each sample to which was applied an increasing direct voltage. To determine the change in the electric characteristics of each sample, samples were subjected to a moisture-resistance test at 85° C. and 85% RH for 1000 hours. 24 hours after the test, the resonance frequency, Fr, the electromechanical coupling factor, Kp, and the dielectric constant, Cx, of each sample were measured, and the change in those characteristics relative to the data of the same sample not subjected to the moisture-resistance test noted. Samples having a change nearer to 0% are better.

On the basis of the test data shown in Table 2, the reasons for the amount of zirconia to be added are mentioned below.

The reason why the amount of zirconia, $ZrO_2$, added is defined to be not smaller than about 1% by weight is because In Table 3, the sample marked with * is outside the scope of the invention.

TABLE 3

| Sample No. | Grain Size of PZT (μm) | Grain Size of $ZrO_2$ (μm) | Degree of combining | Surface Smoothness |
|---|---|---|---|---|
| 10 | 2 | 5 | Δ | o |
| 11 | 2 | 10 | o | o |
| 12 | 2 | 20 | o | o |
| 13 | 2 | 30 | o | o |
| 14 | 2 | 50 | o | X |
| 15 | 0.5 | 20 | o | o |
| 16 | 9 | 20 | o | o |
| 17 | 12 | 20 | Δ | o |
| *18 | 15 | 10 | X | o |
| 19 | 15 | 20 | Δo | |
| 20 | 15 | 30 | Δ | o |

On the basis of the test data shown in Table 3, the reasons for the mean grain size of PZT and that of zirconia are mentioned below.

The reason why the mean grain size of PZT is smaller than that of zirconia is because if the mean grain size of PZT is larger than that of $ZrO_2$, as in Sample No. 18, the sintered ceramics are unfavorably fused and combined together.

The reason why the mean grain size of PZT is preferably not smaller than about 0.5 μm is because if the mean grain size of PZT is smaller than 0.5 μm, the addition of $ZrO_2$ to such PZT is ineffective for improving the piezoelectric characteristics of the ceramic.

The reason why the mean grain size of PZT is preferably not larger than about 9.0 μm is because if the mean grain size of PZT is larger than 10 μm, as in Samples Nos. 17, 19 and 20, the sintered ceramics are fused and combined together to some degree even though within an acceptable range, and are therefore unfavorable.

The reason why the mean grain size of zirconia is preferably not smaller than about 10 μm is because if the mean grain size of $ZrO_2$ is 5 μm, as in Sample No. 10, the sintered ceramics are fused and combined together to some degree even though within an acceptable range, and are therefore unfavorable.

The reason why the mean grain size of zirconia is preferably not larger than about 30 μm is because if the mean grain size of zirconia is 50 μm, as in Sample No. 14, the surface smoothness of the sintered ceramics is poor, even though the sintered ceramics are not fused and combined together and could attain the object of the invention.

EXAMPLE 3

The process of making sintered disc 1 of Example 1, in which 2% by weight of $ZrO_2$ having a mean grain size of 20 μm was added to PZT, was repeated except that the time for the step of $ZrO_2$ addition was varied. The combining degree of sintered ceramics was checked, and the electromechanical coupling factor of each ceramic device obtained was measured. Apart from those samples, also prepared herein was another sample by molding the calcined powder through extrusion molding, and also monitored in the same manner as above to measure the electromechanical coupling factor of the sample. The data obtained are shown in Table 4, in which the samples not combined are marked with "O", and those having been combined to such a degree that they could not be separated into individual ones are marked with "X".

The reason why the step of zirconia addition is after the calcination of piezoelectric ceramics is because if $ZrO_2$ is added prior to the calcination of piezoelectric ceramics, as in Sample No. 30, such is unfavorable since the sintered ceramics are fused and combined together, and since the electromechanical coupling factor of the device obtained is lowered.

Though not supported by the data in Table 4, the reason why the step of zirconia addition is defined to be before the molding of piezoelectric ceramics is because while zirconia could be added to the piezoelectric ceramics, it could not be dispersed in the ceramics.

As seen in Sample 34, even though the piezoelectric ceramic pellets were molded through extrusion molding and $ZrO_2$ was added to the ceramic after the ceramic was calcined and ground and before it was molded, it was confirmed that the sintered ceramics were not fused and combined together.

EXAMPLE 4

Figure 5:
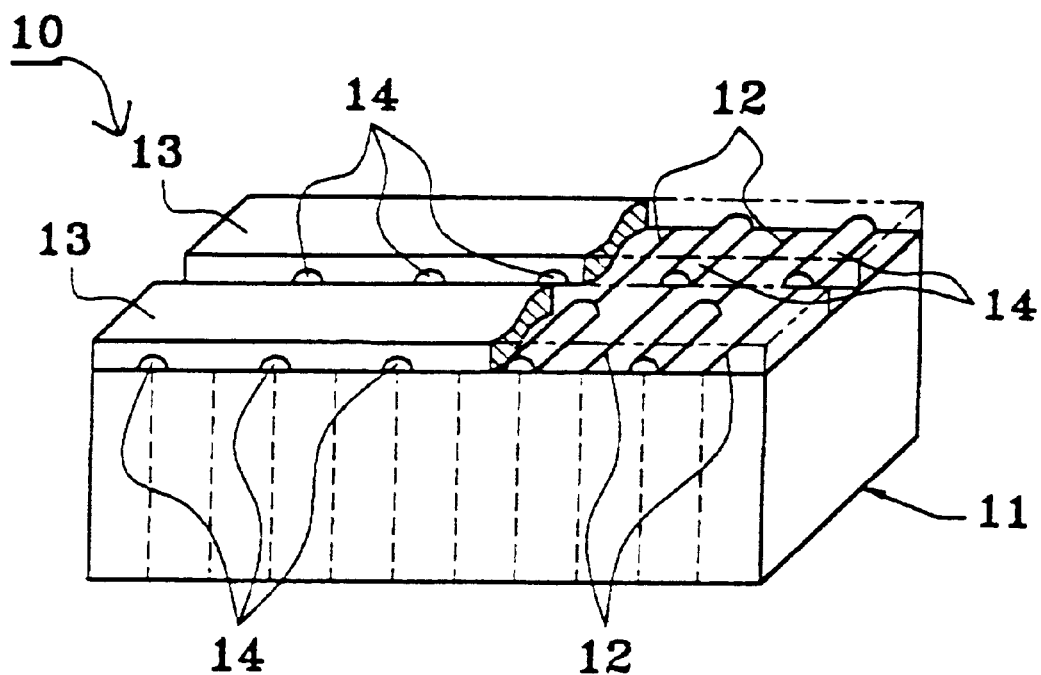
FIG. 5 is a partly-cut, perspective view showing one embodiment of the monolithic piezoelectric ceramic device of the invention.

As illustrated in FIG. 5, a monolithic piezoelectric ceramic device 10 of the invention was formed in the manner mentioned below.

First, raw materials of a piezoelectric ceramic, $TiO_2$, $ZrO_2$ (zirconia) and PbO, were mixed in a ball mill. Next, the resulting mixture was calcined at a temperature falling between 800 and 1000° C., and then ground in an impact grinder to obtain a ground powder.

Next, zirconia, $ZrO_2$, was added to the powder to give a mixed powder. To this was added a binder of polyvinyl acetate acting to solidify it, and stirred to obtain a binder-containing mixture. Next, the binder-containing mixture was molded, using a pulling-type molding machine, to obtain green ceramic sheets having a thickness of from 20 to 100 μm. Some of those green ceramic sheets were screen-printed on one surface with an inner electrode paste comprising Ag-Pd, and were stacked into a laminate. A non-electrode bearing sheet was placed on one end. The resulting laminate was fired in air at a temperature falling between 1000 and 1500° C. for a predetermined period of time to obtain a sintered monolithic body 11 composed of the sintered piezoelectric ceramics 1 and the inner electrodes 12. Next an insulating agent 14 was applied to the exposed area of the inner electrodes 12 of the sintered monolithic body 11 in such a manner that the agent 14 covered the exposed area of alternate inner electrode at the both sheet edges in the widthwise direction, and then two lines of an outer electrode paste comprising Ag were applied onto the sintered monolithic body 11 in parallel to the lengthwise direction of the body 11, and fired at a temperature falling between 800 and

TABLE 4

| Sample No. | Time for $ZnO_2$ Addition (grain size of $ZnO_2$: 20 μm, amount of $ZnO_2$: 2 wt. %) | Degree of Combining | Electromechanical Coupling Factor (resonance in the diffusion direction), k (%) |
|---|---|---|---|
| *30 | before calcination | X | 58.2 |
| 31 | after calcination and before grinding | O | 67.0 |
| 32 | after grinding and before spraying granulation | O | 67.4 |
| 33 | after spraying granulation and before molding | O | 67.5 |
| 34 | after grinding and before extrusion molding | O | 68.0 |

On the basis of the test data shown in Table 4, the reasons for the time for zirconia addition are mentioned below.

900° C. for a predetermined period of time to form thereon outer electrodes 13. Thus was obtained a monolithic, piezoelectric ceramic device 10.

In Examples 1 to 4 mentioned above, PZT was used as the piezoelectric ceramic, but, however, this is not limitative. In producing the sintered ceramics of the invention, any other piezoelectric ceramics, such as PT (lead titanate) ceramics and BT (barium titanate) ceramics, are also employable without interfering with the characteristics of the devices of the invention.

As mentioned in detail hereinabove, the sintered piezoelectric ceramics and the method for producing them of the invention are advantageous in that the ceramics are resistant to the high voltage used for polarization with no dielectric breakdown and have good moisture resistance and that they are prevented from being fused and combined together in the step of firing them. In addition, the production costs for the ceramics are reduced.

Moreover, the piezoelectric ceramic devices and the monolithic piezoelectric ceramic devices of the invention that comprise the sintered piezoelectric ceramics noted above are advantageous in that they are resistant to the high voltage for polarization with no dielectric breakdown and have good moisture resistance. In addition, the laminated, sintered ceramics are prevented from being fused and combined together when producing the monolithic piezoelectric ceramic devices.

While the invention has been described in detail and with reference to specific embodiments thereof, it will be apparent to one skilled in the art that various changes and modifications can be made therein without departing from the spirit and scope thereof.

What is claimed is:

1. A sintered piezoelectric ceramic comprising a mixture of zirconia grains and piezoelectric ceramic grains, in which the mean grain size of the piezoelectric ceramic grains is smaller than that of the zirconia grains.

2. The sintered piezoelectric ceramic as claimed in claim 1, wherein the mean grain size of the piezoelectric ceramic grains is from about 0.5 to 9.0 $\mu$m, and the mean grain size of the zirconia grains is from about 10 to 30 $\mu$m.

3. The sintered piezoelectric ceramic as claimed in claim 2, wherein the amount of the zirconia grains is from about 0.1 to 3.0% by weight of the piezoelectric ceramic grains.

4. The sintered piezoelectric ceramic as claimed in claim 3, wherein the mean grain size of the zirconia grains is from about 15 to 25 $\mu$m and the amount of the zirconia grains is from about 0.5 to 2% by weight of the piezoelectric ceramic grains.

5. The sintered piezoelectric ceramic as claimed in claim 1, wherein the amount of the zirconia grains is from about 0.1 to 3.0% by weight of the piezoelectric ceramic grains.

6. A piezoelectric ceramic device comprising the sintered piezoelectric ceramic of claim 1 having two electrodes on separated surfaces thereof.

7. A piezoelectric ceramic device comprising the sintered piezoelectric ceramic of claim 4 having two electrodes on separated surfaces thereof.

8. A monolithic piezoelectric ceramic device comprising a plurality of superposed layers of the sintered piezoelectric ceramic of claim 1, at least two inner electrodes each of which is disposed between adjacent sintered piezoelectric ceramic layers, and two outer electrodes disposed on separated areas of the outermost surfaces of the plurality of superposed layers, wherein each outer electrode is connected to a different one of the inner electrodes.

9. A monolithic piezoelectric ceramic device comprising a plurality of superposed layers of the sintered piezoelectric ceramic of claim 4, at least two inner electrodes each of which is disposed between adjacent sintered piezoelectric ceramic layers, and two outer electrodes disposed on separated areas of the outermost surfaces of the plurality of superposed layers, wherein each outer electrode is connected to a different one of the inner electrodes.

10. A method for producing sintered piezoelectric ceramics comprising the steps of providing a calcined piezoelectric ceramic body;

grinding the calcined body into a powder;

mixing the powder with a binder to obtain a binder-containing mixture;

molding the mixture into a molding; and firing the molding into a sintered molding;

wherein zirconia grains whose mean grain size is larger than that of the grains of the calcined piezoelectric ceramic are combined with the ceramic after the step of providing the calcined body and before the step of obtaining the molding.

11. A method for producing sintered piezoelectric ceramics of claim 10 comprising the step of granulating the binder-containing mixture into granular pellets before molding the mixture into a molding.

12. The method for producing sintered piezoelectric ceramics of claim 11, wherein the zirconia grains are added to the ceramic after the step of preparing the granular pellets.

13. The method for producing sintered piezoelectric ceramics of claim 12, wherein the amount of the zirconia grains is from about 0.5 to 2% by weight of the calcined ceramic and the mean grain size of the zirconia grains is between about 15 and 25 $\mu$m and wherein the mean grain size of the sintered ceramic grains is between about 0.5 and 9.0 $\mu$m.

14. The method for producing sintered piezoelectric ceramics of claim 10, wherein the zirconia grains are added to the ground powder of the calcined body.

15. The method for producing sintered piezoelectric ceramics of claim 10, wherein the zirconia grains are added to the ceramic during or after the step of preparing the binder-containing mixture.

16. The method for producing sintered piezoelectric ceramics of claims 10, wherein the mean grain size of the sintered ceramic grains is between about 0.5 and 9.0 $\mu$m and the mean grain size of the zirconia grains is between about 10 and 30 $\mu$m.

17. The method for producing sintered piezoelectric ceramics of claim 16, wherein the amount of the zirconia grains is from about 0.1 to 3.0% by weight of the calcined ceramic.

18. The method for producing sintered piezoelectric ceramics of claim 17, wherein the amount of the zirconia grains is from about 0.5 to 2% by weight of the calcined ceramic and the mean grain size of the zirconia grains is between about 15 and 25 $\mu$m.

19. The method for producing sintered piezoelectric ceramics of claim 10, wherein the amount of the zirconia grains is from about 0.1 to 3.0% by weight of the calcined ceramic.

20. The method for producing sintered piezoelectric ceramics of claim 19, wherein the amount of the zirconia grains is from about 0.5 to 2% by weight of the calcined ceramic and the mean grain size of the zirconia grains is between about 15 and 25 $\mu$m.

* * * * *